(12) United States Patent
Bolvardi et al.

(10) Patent No.: US 10,774,416 B2
(45) Date of Patent: Sep. 15, 2020

(54) COATING MATERIAL COMPRISING A TERNARY PHASE OF HF—B—C

(71) Applicant: Oerlikon Surface Solutions AG, Pfäffikon (CH)

(72) Inventors: Hamid Bolvardi, Chur (CH); Mirjam Arndt, Bad Ragaz (CH); Helmut Rudigier, Chur (CH); Jochen Schneider, Aachen (DE); Konda Gokuldoss Pradeep, Aachen (DE)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 178 days.

(21) Appl. No.: 15/768,765

(22) PCT Filed: Oct. 14, 2016

(86) PCT No.: PCT/EP2016/001704
§ 371 (c)(1),
(2) Date: Apr. 16, 2018

(87) PCT Pub. No.: WO2017/063744
PCT Pub. Date: Apr. 20, 2017

(65) Prior Publication Data
US 2019/0062897 A1    Feb. 28, 2019

Related U.S. Application Data

(60) Provisional application No. 62/242,428, filed on Oct. 16, 2015.

(51) Int. Cl.
*C23C 14/06* (2006.01)
*C23C 14/34* (2006.01)
(Continued)

(52) U.S. Cl.
CPC ........ *C23C 14/0635* (2013.01); *C01B 32/956* (2017.08); *C23C 14/067* (2013.01);
(Continued)

(58) Field of Classification Search
USPC ............ 204/192.12, 192.15, 192.16, 298.12; 51/307, 309; 428/698, 704
See application file for complete search history.

(56) References Cited

U.S. PATENT DOCUMENTS 7,691,496 B2 *  4/2010  Park .......................... C23C 4/12
                                                    428/698
8,496,793 B2 *  7/2013  Ramm .................. C23C 14/325
                                                    204/298.41

(Continued)

FOREIGN PATENT DOCUMENTS

CN      104781444 A    7/2015
WO      2014053209 A1  4/2014

OTHER PUBLICATIONS

Zhong et al "Composition and oxidation resistance of Ti—B—C and Ti—B—C—N coatings deposited by magnetron sputtering" Surface & Coatings Techn 163-164 p. 50-56 (Year: 2003).*

(Continued)

*Primary Examiner* — Archene A Turner
(74) *Attorney, Agent, or Firm* — Polson Intellectual Property Law, PC; Margaret Polson

(57) ABSTRACT

The present disclosure relates to a coated substrate with a coating deposited on at least a part of the substrate surface, said coating comprising at least one metal boron carbide layer, characterized in that the metal boron carbide layer is a ternary compound exhibiting a polycrystalline structure formed of a single phase of hafnium, boron and carbon. Further a method for deposition of such a coating is provided.

19 Claims, 4 Drawing Sheets

(51) Int. Cl.
*C01B 32/956* (2017.01)
*C23C 14/35* (2006.01)
(52) U.S. Cl.
CPC ........ *C23C 14/345* (2013.01); *C23C 14/3414* (2013.01); *C23C 14/3485* (2013.01); *C23C 14/35* (2013.01)

(56) References Cited

U.S. PATENT DOCUMENTS

| | | | |
|---|---|---|---|
| 2010/0247885 A1* | 9/2010 | Ito | F16C 33/043 428/216 |
| 2015/0232982 A1* | 8/2015 | Arndt | H01J 37/3467 204/192.16 |

OTHER PUBLICATIONS

Levashov et al "Structure & properties of Ti—C—B composite thin films produced by sputtering of composite TiC—TiB2 targets" Surface & Coatings Techn 92 p. 34-41. (Year: 1997).*

Office Action dated Jul. 3, 2019 in related Chinese application 201680059998.X.
"Conformal growth of low friction HfBxCyhard coatings", E. Mohimi et al., <Thin Solid Films>, vol. 592, pp. 182-188.
"Hard multifunctional Hf—B—Si—C films prepared by pulsed magnetron sputtering", Jiri Kohout et al., <Surface & Coatings Technology>, vol. 257, pp. 301-307.
International Search Report dated Jan. 30, 2017 in parent International application PCT/EP2016/001704. 4 pages.
Written Opinion of the International Searching Authority dated Jan. 30, 2017 in parent International application PCT/EP2016/001704. 6 pages.
E. Mohimi et al: "Conformal growth of low friction HfBxCy hard coatings". Thin Solid Films.vol. 592. Sep. 12, 2015 (Sep. 12, 2015). pp. 182-188. XP055336748. CH, ISSN: 0040-6090. DOI: 10.1016jj.tsf.2015.09.018, section 3.3. 8 pages.
Zhang, Minghui, et al: "Effect of the Si content on the microstructure of hard multifunctional Hf—B—Si—C films prepared by pulsed magnetron sputtering". Applied Surface Science vol. 357. Oct. 3, 2015 (Oct. 3, 2015). pp. 1343-1354. XP029338793. ISSN: 0169-4332. DOI: 10.1016/J.APSUSC.2015.09.249, section 2.1; section 3.3.4. 12 pages.

* cited by examiner

COATING MATERIAL COMPRISING A TERNARY PHASE OF HF—B—C

BACKGROUND

The present disclosure relates to a coating material formed by a ternary phase of hafnium boron and carbon, which can be deposited on surfaces of components and tools for improving their performance. The present disclosure relates furthermore to a method for producing this coating material.

The use of metal boron carbide materials as coating as well as the production of this kind of coating by using physical vapour deposition (PVD) techniques is well known from the state of the art.

In the theoretical "Systematic study on the electronic structure and mechanical properties of $X_2BC$ (X=Mo, Ti, V, Zr, Nb, Hf, Ta and W)" published in J. Phys.: Condens. Matter 25 (2013) 045501 (6pp), it was reported that $Mo_2BC$-type phases were investigated by using quantum mechanics calculations for predicting properties in case Mo was replaced by other transitional metals, such as Ti, V, Zr, Nb, Hf, Ta or W. According to the calculations a higher level of ductility is expected for higher values of valence electron concentration (VEC), as inferred from both the more positive Cauchy pressure and the larger value of the bulk to shear modulus ratio (B/G). As conclusion of this study, it was indicated that this rather unusual combination of high stiffness and moderate ductility renders $X_2BC$ compounds with X=Ta, Mo and W as promising candidates for protection of cutting and forming tools.

WO2014053209A1 discloses for example a method for producing metal boron carbide coatings by using pulsed PVD processes. In particular, WO2014053209A1 suggests use of high-power impulse magnetron sputtering (HiPIMS) technique, whereby very high current and correspondingly, power densities must be applied as impulses. In this manner, it was possible to form microcrystalline phases of metal boron carbides; more specifically $Mo_2BC$ at temperatures below 600° C., which could otherwise only be synthesized by conventional dc magnetron sputtering at substrate temperatures above 600° C. WO2014053209A1 discloses furthermore that metal boron carbides formed from transition metals such as Ti, Zr, Hf, V, Nb, Ta, Cr, Mo and W should be particularly suitable for attaining good wear resistance or low friction coefficients. However not all of these possibly suitable metal boron carbides are available or can be produced, until now.

Moreover, the previously depicted method for producing metal boron carbide coatings by means of HiPIMS techniques is normally expensive and complex. Also, the proposed microcrystalline $Mo_2BC$ coatings exhibit in addition to their microcrystalline phase a significant amount of amorphous and/or nanocrystalline phases. This physical nature of the known microcrystalline $Mo_2BC$ coatings limits the industrial use of them because the mechanical and thermal properties of such materials are often governed by the properties of the amorphous and/or nanocrystalline grain boundary phase.

The previously depicted drawbacks known from the state of the art imply that a metal boron carbide, being able to suit the high demands in industrial applications with excellent mechanical properties, should exhibit essentially a single phase crystalline structure.

The foregoing examples of the related art and limitations therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tool and methods which are meant to be exemplary and illustrative, not limiting in scope. In various embodiments, one or more of the above described problems have been reduced or eliminated, while other embodiments are directed to other improvements.

Proceeding from the foregoing, an aspect of the present disclosure is to provide a coating material which can be produced in an easy manner and which can provide a similar or better performance to components and tools, in particular cutting and/or forming tools in comparison with state of the art metal boron carbide coatings, as e.g. $Mo_2BC$.

This was attained by producing a new coating material comprising a ternary phase material formed of hafnium, boron and carbon. The new synthetized ternary phase exhibits a chemical composition corresponding to the formula $HfB_xC_{1-x}$. In this regard, it is to be understood that when $x=0.5$, then the chemical composition of the ternary phase would be $Hf_1B_{0.5}C_{0.5}$ and this chemical composition corresponds to $Hf_2BC$.

In the context of the present disclosure it is also to be understood that the term "ternary phase material" formed of hafnium, boron and carbon, is used for referring to a material exhibiting a singular polycrystalline phase formed of the ternary system hafnium, boron and carbon.

In spite of the expectation that $X_2BC$ compounds with X=Ta, Mo and W were more promising as coating material for cutting and forming tools, as indicated by the state of the art mentioned above, attempts to synthetize for the first time a material comprising the ternary phase $Hf_2BC$ were made. Hereafter the ternary phase $Hf_2BC$ will also be referred to as the stoichiometric $Hf_2BC$ phase.

In addition to the aspects and embodiments described above, further aspects and embodiments will become apparent by reference to the accompanying drawings and the detailed description forming a part of this specification.

DESCRIPTION

Figure 1:
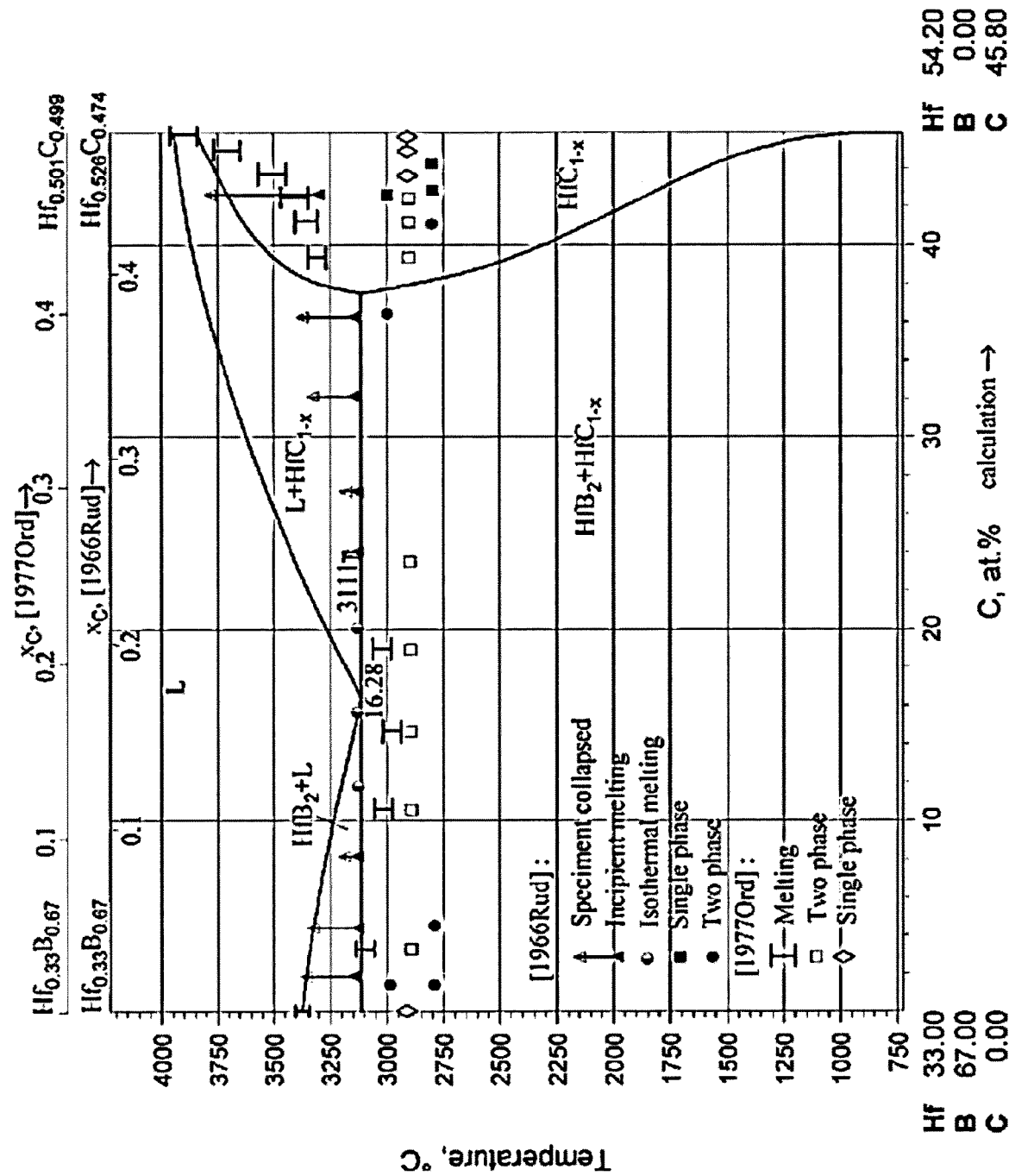
FIG. 1 shows a quasiternary diagram.

Before further explaining the depicted embodiments, it is to be understood that the invention is not limited in its application to the details of the particular arrangements shown, since the invention is capable of other embodiments. It is intended that the embodiments and figures disclosed herein are to be considered illustrative rather than limiting. Also, the terminology used herein is for the purposes of description and not limitation.

Formation of the stoichiometric phase did not appear to be feasible based on the available phase diagram data, which exhibited a decomposition of liquid Hf—B—C phase to thermodynamically stable solid $HfB_2$ and $HfC$ binary phases, portrayed in the quasiternary diagram shown in FIG.

1 (taken from: Peter Rogl, Refractory Metal Systems: Phase Diagrams, Crystallographic and Thermodynamic Data, Landolt-Bornstein New Series IV/11E1, Springer 2009). Also, the formation of microcrystalline $Hf_2BC$ was not expected from a magnetron sputtering technique below 600° C., as described in WO2014053209A1 above.

Therefore, it was especially unexpected to form any Hf—B—C ternary compounds capable of being stabilized in a single polycrystalline phase at room temperature. However, a single phase of Hf—B—C was surprisingly synthesized by using the coating parameters and conditions described below.

Unexpectedly, it was possible to synthetize a ternary compound of hafnium, boron and carbon exhibiting a single phase for the first time by using as material source a target comprising a combination of the binary phases $HfB_2$ and HfC. The target was prepared by using powder metallurgical techniques to obtain a homogeneous source material exhibiting a refined particle size, specifically displaying binary regions having particle sizes less than 1.5 mm each. Accordingly, these targets are shown to be particularly suitable for promoting the single phase formation. The substrate temperature also plays a major role in the formation of the single phase. Experimentation revealed that the use of high substrate temperatures leads to the formation of a coating material comprising the binary phases $HfB_2$ and HfC instead of the stoichiometric phase $Hf_2BC$ or any single polycrystalline phase formed of hafnium, boron and carbon. According to the present disclosure, substrate temperatures not higher than approximately 450° C. were found to be suitable for the formation of a ternary phase of Hf—B—C. Substrate temperatures not higher than 600° C., preferably not higher than 500° C., was recommended in order to prevent decomposition of the above mentioned ternary phase of Hf—B—C exhibiting a single polycrystalline phase into the binary $HfB_2$ and HfC phases during deposition.

The synthetized coatings showed a considerably high hardness of approximately 30 GPa which was measured with a depth-sensing nanoindenter equipped with a Berkovich tip.

The coatings were deposited by means of magnetron sputtering of the already previously described targets consisting of a combination of the binary phases $HfB_2$ and HfC. For the deposition of the Hf—B—C films in one disclosure, at least one target was sputtered in a non-reactive atmosphere comprising argon as process gas. The required sputtering power was provided by using a DC power supply. A negative bias voltage was applied at the substrate to be coated. Different experiments showed that too high bias voltage values can lead to delamination of the coating caused by poor adhesion and even breakage. Particularly good results were obtained by using a bias voltage of −50 V. It is however important to mention that also bias voltage values of −30 V to −100 V could be used depending on the other process parameters. The Ar pressure during the process was kept constant at 0.35 Pa. The production of the coatings could be achieved by use of another inert gas instead of argon, or other inert gases, or a mixture with argon. Likewise, it is recommended to use inert gas pressures of 0.3 to 0.4 Pa during the process. Lower pressures may extinguish the plasma and higher pressures decrease the adatom energy and subsequent surface mobility of film forming species. This can affect the synthesis adversely.

Figure 2:
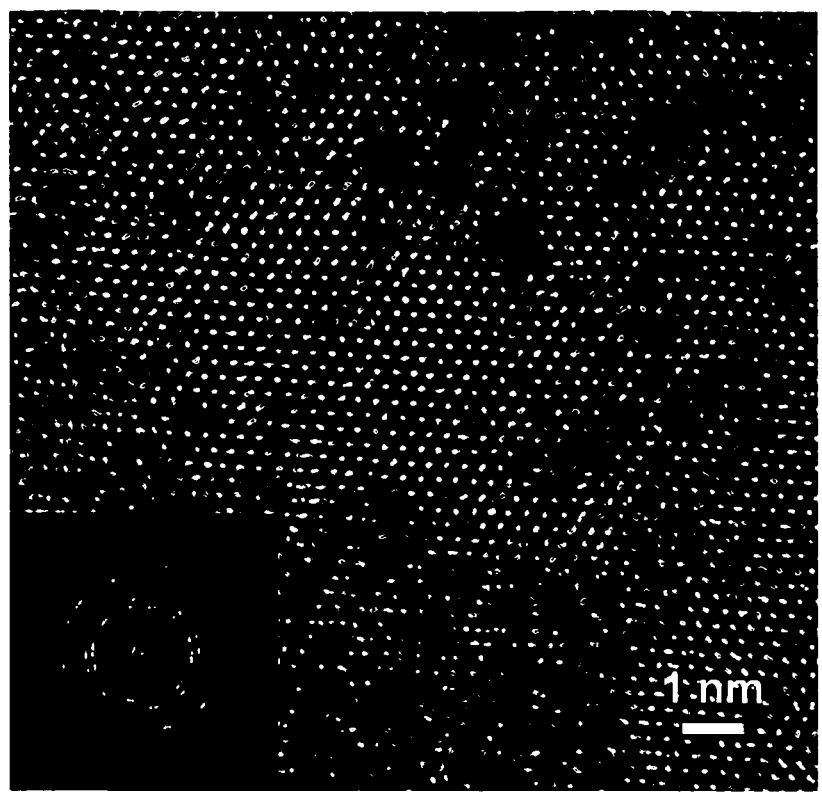
FIG. 2 shows an inset of TEM image and SAED analysis.

The films were subsequently examined by transmission electron microscopy (TEM) and selected area electron diffraction (SAED). No evidence for the formation of an amorphous phase can be seen from the TEM image and SAED analysis in the inset shown in FIG. 2. Rather, a high degree of crystallinity can be estimated from the relatively sharp diffraction spots. The ring shape of the diffraction spots is attributed to the polycrystalline nature of the investigated ternary phase of Hf—B—C coating sample, which as previously mentioned corresponds to a singular polycrystalline phase formed of the ternary system hafnium, boron and carbon.

Figure 3:
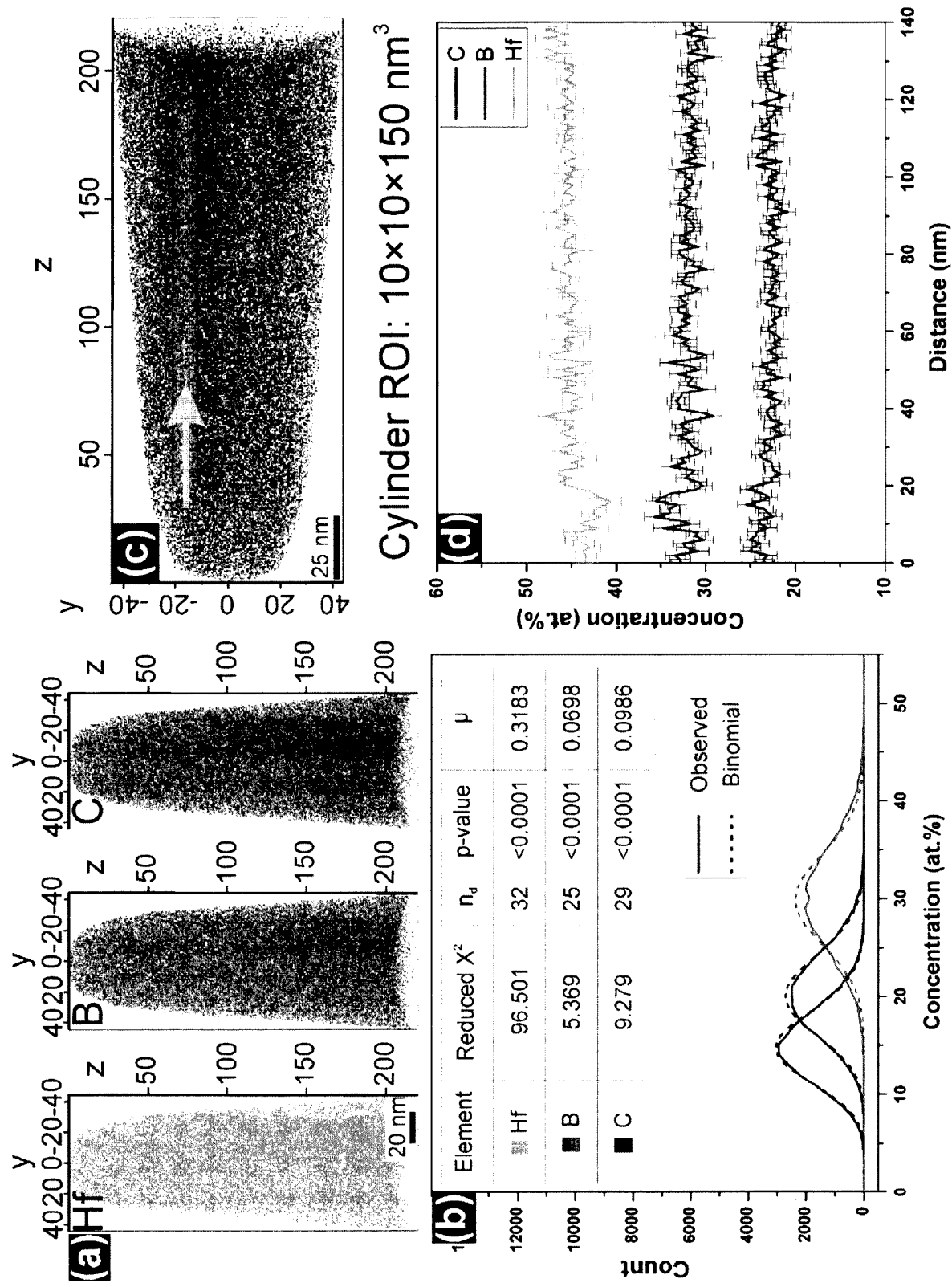
FIG. 3 shows results for the distribution of chemical composition.

The distribution of the chemical composition was measured precisely by Atom probe. The results are shown in the FIG. 3. From these results it is clear that the formation of the binary phases can be excluded. The uniform distribution of the chemical elements suggests that a ternary phase formed of hafnium boron and carbon, exhibiting a single phase of the present disclosure is formed. However, chemical composition does not give enough information to identify precisely which kind of crystallographic structure it is. It could be, for example, the orthorhombic structure of the stoichiometric $Hf_2BC$ phase or the cubic $HfB_xC_{1-x}$ phase.

The chemical composition of the synthesized ternary phase comprising coatings of the present disclosure can be expressed by using the formula $Hf_{100-b-c}B_bC_c$, with 100−b−c>>b and 100−b−c>>c, with the coefficients b and c in atomic percentage.

According to a preferred embodiment of the present disclosure, b and c are not higher than 35 at.-% and preferably 100−b−c is not higher than 60 at.-%.

According to a further preferred embodiment of the present disclosure, b and c fulfil the condition b<30 at.-%, c<30 at.-%. Good properties were observed by coatings in which c>b.

The chemical composition of the synthesized ternary phase comprising coatings of the present disclosure can in equivalent manner be expressed by using the formula $Hf_uB_vC_w$, with u+v+w=100 and u>>v>0 and u>>w>0. According to a preferred embodiment of the present disclosure, v and w are not higher than 35 at. % and preferably u is not higher than 60 at. %. A preferred embodiment of the present disclosure is produced when using this formula for expressing the chemical composition of the coatings, where then v and w fulfil the condition 0<v<35 at.-%, 0<w<35 at.-%.

Unavoidable impurities of metallic or non-metallic residuals can be included up to maximum 2 at. % and should not be considered in the chemical composition of the single phase $Hf_uB_vC_w$. Such impurities can arise from other metallic elements in the target, like Ti, Zr, V, Nb, Ta, Cr, Mo, W which stem from target production, or e.g. from contamination of the target-/substrate-/chamber-surface by oxygen or nitrogen, as well as unavoidable incorporation of the process gasses like e.g. Ar, He, Ne, Kr.

In particular, very good coating properties were exhibited by coatings having chemical composition in atomic percentage corresponding to $Hf_{50}B_{21}C_{29}$.

All synthesized coatings showed a high crystallinity and they were investigated by XRD examinations in order to determine the crystal structure present in the polycrystalline coatings.

Figure 4:
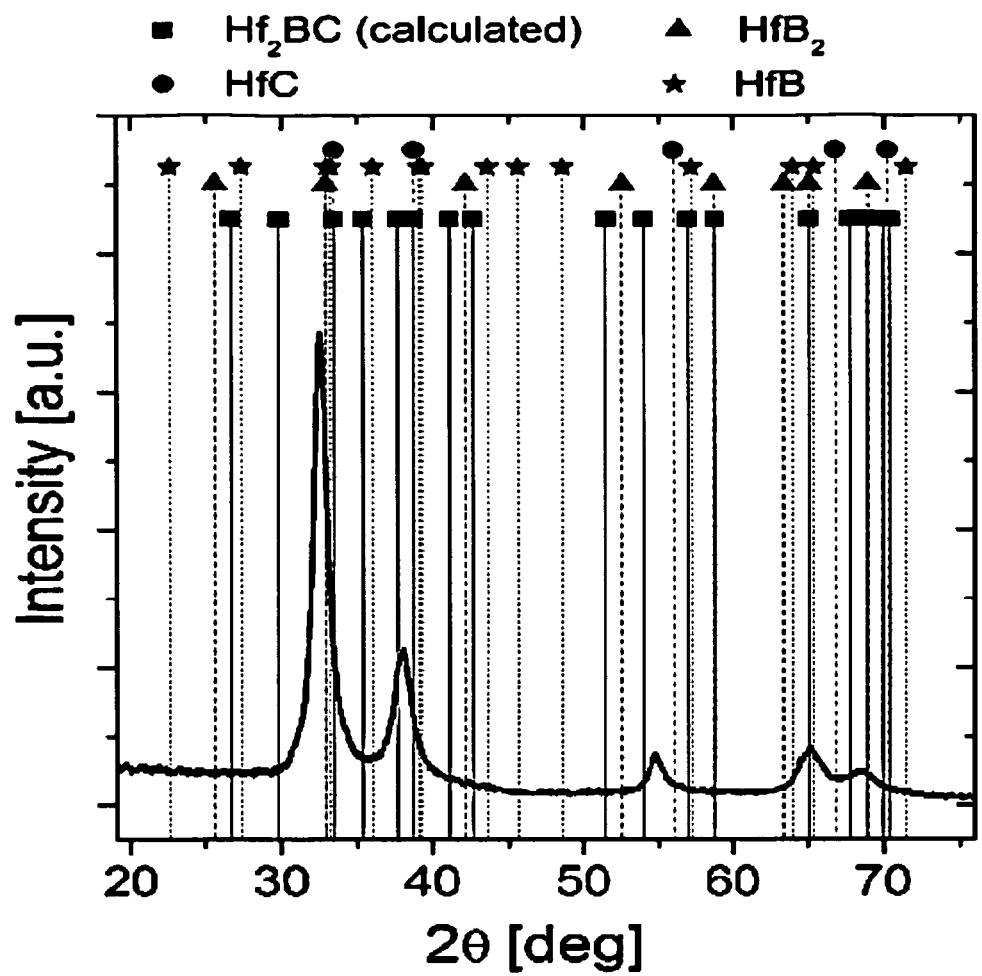
FIG. 4 shows a diffractogram of an as-deposited film.

FIG. 4 shows a diffractogram of an as-deposited film. The peak intensities corresponding to a theoretically predicted orthorhombic $Hf_2BC$ phase, whose 2theta and intensities were calculated by using quantum mechanics calculation methods, are indicated as squares. The peak positions of $HfB_2$ (hexagonal), HfC (cubic) and HfB (cubic) phases are indicated as triangles, circles and stars, respectively, based on the powder diffraction files available from JCPDS database.

By analysis of only the initial XRD examinations of the Hf—B—C coatings having chemical composition given by the formula $Hf_{100-b-c}B_bC_c$ or $Hf_uB_vC_w$ as explained above, it was not possible to determine exactly which kind of single phase of hafnium formed; boron and carbon was also formed, but more exactly, it was not possible to determine if the deposited films exhibit a cubic polycrystalline structure or an orthorhombic polycrystalline structure. Therefore, a more detailed analysis of the XRD and TEM examinations would be necessary for determining the exact crystal structure present in the polycrystalline coatings exhibiting a ternary phase of Hf—B—C of the present disclosure. In other words, until now it remained difficult to distinguish if the films consisting essentially of a ternary compound of Hf, B and C showing a single phase, exhibit a cubic $HfB_xC_{1-x}$ solid solution structure or an orthorhombic $Hf_2BC$ structure.

Magnetron sputtering was found to be a suitable PVD method for producing the ternary phase films of Hf—B—C, characterized by exhibiting a single phase formed of hafnium, boron and carbon of the present disclosure. However, the methods for depositing the films are not limited to conventional DC magnetron sputtering but can also include for example HiPIMS and arc PVD or other PVD methods.

It is however clearly visible from FIG. 4 that the deposited Hf—B—C coating material is present in the form of a single phase solid solution with high crystallinity.

The application of the Hf—B—C coating material with a chemical composition specified by the formulas as previously depicted are primarily observed as protective coatings on tools or components like machining operations such as drilling or milling for example, but can also form operations of metals at moderate temperatures such as cold forming or extrusion of aluminium-, copper- or iron-alloys for example. Additional fields of application can be found as protective coating on dies or moulds in metal casting, or as low-friction coatings on components of sliding members in dry and lubricated conditions with a high load collective.

The present disclosure depicts a coated substrate with a coating deposited on a surface of the substrate. Said coating is comprised of at least one metal boron carbide layer, wherein the metal boron carbide layer is a ternary compound exhibiting a polycrystalline structure formed of a single phase of hafnium, boron and carbon.

The ternary compound preferably has a chemical composition in an atomic percentage that can be expressed by the formula $Hf_uB_vC_x$, wherein u+v+w=100, 0<v<35 at.-%, 0<w<35 at.-% and u<60 at.-%.

The single phase preferably exhibits a cubic solid solution structure or an orthorhombic structure.

The present disclosure discloses also a method for producing the previously depicted coated substrate, wherein the method is comprised of at least the following steps:
  providing at least one substrate to be coated in a coating chamber,
  depositing a layer of a ternary compound on at least a portion of the surface of the substrate, wherein said ternary compound layer is produced by using PVD techniques, wherein at least one target comprising a combination of the binary phases $HfB_2$ and HfC is used as material source for the layer deposition.

Preferably, at least one target exhibits binary phase regions with particle sizes of less than 1.5 mm.

Preferably, the substrate temperature during deposition of the ternary compound layer is not higher than 500° C.

Preferably, a bias voltage is applied at the substrate during deposition of the ternary compound layer, wherein the bias voltage value is between −30 V and −100 V.

Preferably, the pressure in the coating chamber during deposition of the ternary compound layer is between 0.3 and 0.4 Pa.

In particular, a coated substrate according to the present disclosure is a sliding component coated with a coating of the previously depicted embodiments.

In such a case the coated sliding component can be used under unlubricated or lubricated conditions. Moreover, the coating deposited on at least some parts of the sliding component can be designed to comprise of at least one layer of hafnium, boron and carbon, further consisting of a dense, single phase structure of $Hf_uB_vC_w$ with high crystallinity, wherein u+v+w=100 and 30>v>0 at. % and 30>w>0 and u<60 at. %.

Also, a coated substrate of the present disclosure can be a tool for machining operations or a tool for forming operations coated with a coating of the previously depicted embodiments.

The invention was described based on exemplary embodiments. A person skilled in the art will derive numerous embodiments for implementing the invention without departing from the scope of the present claims. While several aspects and embodiments have been discussed above, those of skill in the art will recognize certain modifications, permutations, additions and sub-combinations therefore. It is therefore intended that the following appended claims hereinafter introduced are interpreted to include all such modifications, permutations, additions and sub-combinations, which are within their true spirit and scope. Each embodiment described herein has numerous equivalents.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, although the present disclosure has been specifically disclosed by preferred embodiments and optional features, modification and variation of the concepts herein disclosed may be resorted to by those skilled in the art, and that such modifications and variations are considered to be within the scope of this invention as defined by the appended claims. Whenever a range is given in the specification, all intermediate ranges and subranges, as well as all individual values included in the ranges given are intended to be included in the disclosure. When a Markush group or other grouping is used herein, all individual members of the group and all combinations and sub-combinations possible of the group are intended to be individually included in the disclosure.

In general, the terms and phrases used herein have their art-recognized meaning, which can be found by reference to standard texts, journal references and contexts known to those skilled in the art. The above definitions are provided to clarify their specific use in the context of the invention.

The invention claimed is:

1. Coated substrate with a coating deposited on a surface of the substrate, said coating comprising at least one metal boron carbide layer, wherein the metal boron carbide layer is a ternary compound exhibiting a polycrystalline structure formed of a single phase of hafnium, boron and carbon.

2. Coated substrate of claim 1, wherein the ternary compound has a chemical composition in atomic percentage that can be expressed by the formula $Hf_uB_vC_w$, wherein u+v+w=100, 0<v<35 at.-%, 0<w<35 at.-% and u<60 at.-%.

3. Coated substrate of claim 1, wherein the single phase exhibits a cubic solid solution structure or an orthorhombic structure.

4. Coated substrate of claim 2, wherein the single phase exhibits a cubic solid solution structure or an orthorhombic structure.

5. Method for producing a coated substrate of claim 1, wherein the method comprises following steps:
provinding at least one substrate to be coated in a coating chamber,
depositing a layer of a ternary compound on at least a portion of the surface of the substrate, wherein said ternary compound layer is produced by using PVD techniques, wherein at least one target comprising a combination of the binary phases $HfB_2$ and $HfC$ is used as material source for the layer deposition.

6. Method for producing a coated substrate of claim 2, wherein the method comprises following steps:
providing at least one substrate to be coated in a coating chamber,
depositing a layer of a ternary compound on at least a portion of the surface of the substrate, wherein said ternary compound layer is produced by using PVD techniques, wherein at least one target comprising a combination of the binary phases $HfB_2$ and $HfC$ is used as material source for the layer deposition.

7. Method of claim 5, wherein the at least one target exhibits binary phase regions with particle sizes of less than 1.5 mm.

8. Method of claim 6, wherein the at least one target exhibits binary phase regions with particle sizes of less than 1.5 mm.

9. Method of claim 5, wherein the substrate temperature during deposition of the ternary compound layer is not higher than 500° C.

10. Method of claim 6, wherein the substrate temperature during deposition of the ternary compound layer is not higher than 500° C.

11. Method of claim 7, wherein a bias voltage is applied at the substrate during deposition of the ternary compound layer, wherein the bias voltage value is between −30 V and −100 V.

12. Method of claim 9, wherein a bias voltage is applied at the substrate during deposition of the ternary compound layer, wherein the bias voltage value is between −30 V and −100 V.

13. Method of claim 5, wherein the pressure in the coating chamber during deposition of the ternary compound layer is between 0.3 and 0.4 Pa.

14. Method of claim 7, wherein the pressure in the coating chamber during deposition of the ternary compound layer is between 0.3 and 0.4 Pa.

15. Method of claim 9, wherein the pressure in the coating chamber during deposition of the ternary compound layer is between 0.3 and 0.4 Pa.

16. Coated substrate of claim 1, wherein the substrate is a sliding component.

17. Coated substrate of claim 2, wherein the substrate is a sliding component.

18. Coated substrate of claim 1, wherein the substrate is a tool for machining operations or a tool for forming operations.

19. Coated substrate of claim 2, wherein the substrate is a tool for machining operations or a tool for forming operations.

* * * * *